US012800640B2

(12) United States Patent
Raith et al.

(10) Patent No.: US 12,800,640 B2
(45) Date of Patent: Nov. 17, 2026

(54) METHOD FOR AGING ASSESSMENT AND IN PARTICULAR STATUS MONITORING, COMPUTER PROGRAM, AND COMPUTER-READABLE MEDIUM

(71) Applicant: Siemens Energy Global GmbH & Co. KG, Munich (DE)

(72) Inventors: Johannes Raith, Passail (AT); Mario Scala, Graz (AT)

(73) Assignee: Siemens Energy Global GmbH & Co. KG, Munich (DE)

( * ) Notice: Subject to any disclaimer, the term of this patent is extended or adjusted under 35 U.S.C. 154(b) by 370 days.

(21) Appl. No.: 18/597,244

(22) Filed: Mar. 6, 2024

(65) Prior Publication Data

US 2024/0302423 A1 Sep. 12, 2024

(30) Foreign Application Priority Data

Mar. 8, 2023 (DE) ..................... 10 2023 202 056.4

(51) Int. Cl.
*G01R 31/12* (2020.01)
*G01R 31/62* (2020.01)

(52) U.S. Cl.
CPC ............. *G01R 31/12* (2013.01); *G01R 31/62* (2020.01)

(58) Field of Classification Search
CPC ..... G01R 31/12; G01R 31/62; G01R 2119/04
See application file for complete search history.

(56) References Cited

U.S. PATENT DOCUMENTS 6,609,079 B1 8/2003 Seitlinger

FOREIGN PATENT DOCUMENTS

| | | | | | |
|---|---|---|---|---|---|
| CN | 112257232 | A | | 1/2021 | |
| CN | 114814568 | A | * | 7/2022 | G01R 31/1227 |
| CN | 111596184 | B | * | 7/2023 | G01R 31/1263 |
| WO | WO 9960682 | A1 | | 11/1999 | |
| WO | WO-2019015805 | A1 | * | 1/2019 | G06F 30/23 |
| WO | WO-2020258835 | A1 | * | 12/2020 | G01R 27/2605 |

OTHER PUBLICATIONS

IEC 60076-7; Power transformers—Edition 2.0 Jan. 2018; Part 7: Loading guide for mineral-oil-immersed power transformers; Apr. 12, 2018; Scala, Mario; STA, EM TR LPT GTC RES STW 3.

(Continued)

*Primary Examiner* — Sujoy K Kundu
(74) *Attorney, Agent, or Firm* — Laurence A. Greenberg; Werner H. Stemer; Ralph E. Locher

(57) ABSTRACT

A method for assessing the aging or monitoring the status of an electrical device that has a solid insulation arrangement and a liquid and/or gaseous insulating medium in contact with the solid insulation arrangement. In a first step S1, a thermo-hydraulic aging model is provided and a simulation for the electrical device is carried out. S2) local temperatures are calculated for various areas of the electrical device in the scope of the simulation; and S3) amounts of at least one aging product, which arises due to the aging of the solid insulation arrangement and passes into the insulating medium, are calculated for the various areas. There is also provided a corresponding computer program and a computer-readable medium.

20 Claims, 6 Drawing Sheets

(56) References Cited

OTHER PUBLICATIONS

Raith, J, et al., Simulation of long-term transformer operation with a dynamic thermal, moisture and aging model; Siemens AG Oesterreich, Simulation of long-term transformer operation with a dynamic thermal, moisture and aging model, 5th International Colloquium on Transformer Research and Asset Management; https://doi.org/10.1007/978-981-15-5600-5_17; 2018.

Krause, Christoph, et al., The Condition of Solid Transformer Insulation at End-of-Life; Electra N°321 Apr. 2022; SC A2 Electra #321 Reference Paper; 2022.

Diagnosis of Thermal Degradation for Thermally Upgraded Paper in Mineral Oil; Naoki Yamagata et al., 2008 International Conference on Condition Monitoring and Diagnosis, Beijing, China, Apr. 21-24, 2008; 978-1-4244-1622-6/08/$25.00 © 2007 IEEE; 2008.

* cited by examiner

METHOD FOR AGING ASSESSMENT AND IN PARTICULAR STATUS MONITORING, COMPUTER PROGRAM, AND COMPUTER-READABLE MEDIUM

CROSS-REFERENCE TO RELATED APPLICATION

This application claims the priority, under 35 U.S.C. § 119, of German Patent Application DE 10 2023 202 056.4, filed Mar. 8, 2023; the prior application is herewith incorporated by reference in its entirety.

FIELD AND BACKGROUND OF THE INVENTION

The invention relates to a method for aging assessment and in particular status monitoring of an electrical device, such as a transformer or a choke, comprising a solid insulation arrangement and a liquid and/or gaseous insulating medium in contact with the solid insulation arrangement. In addition, the invention relates to a computer program and a computer-readable medium.

Insulation systems of electrical devices often consist of a combination of an insulating medium, which can be made liquid or gaseous, and a solid insulation arrangement. The latter is typically based on cellulose. Substances which arise due to the aging of the solid insulation, pass into the insulating medium, and can be detected there, are also viewed as "aging markers." However, there is a lack of quantitative inference about the load of the most strongly strained areas, since the information detected metrologically only supplies an integral value. Therefore, an ability to provide information is restricted, for example, to a traffic signal function having limiting values. In particular, there is a lack of a reliable assignment as to whether a metrologically observed amount of "aging markers" is in accordance with operation or whether there is a suspicion of faulty behavior of the electrical device.

It is known to the applicant that attempts have sometimes been made to perform an adaptation of integral measurement results by empirical factors, in order to thus be able to conclude an aging status in the hottest or most critical area (so-called "hotspot"). However, this approach can at most provide very rough information, since the temperature distribution is subject to various parameters which are dependent on the design of the electrical device, such as a transformer, and which can change during its operation.

A thermo-hydraulic aging model (THAM) for a transformer is disclosed in the article "Simulation of long-term transformer operation with a dynamic thermal, moisture and aging model", 5th International Colloquium on Transformer Research and Asset Management, October 2018, Opatija, Croatia (further publication of the article: 5th International Colloquium on Transformer Research and Asset Management, Lecture Notes in Electrical Engineering, vol 671. Springer, Singapore, 2020, https://doi.org/10.1007/978-981-15-5600-5_17). Using that model, the long-term operation of a transformer is simulated in a case study, of which, inter alia, windings, the core, and a cooling arrangement are located in a tank filled with oil as a liquid insulating medium. Core and windings and further transformation components are provided here with a cellulose-based solid insulation arrangement. This comprises pressboard and paper, which are wrapped around the conductor. The components are modeled using various branches having specific properties, which are connected by nodes, in order to obtain a thermo-hydraulic network model. Temperatures and local moisture values resulting therefrom are calculated at different points or positions of the solid insulation arrangement, from which local DP numbers result by application of an aging formula.

A method and an arrangement for determining state variables are disclosed in published international application WO 99/60682 A1. To determine temperatures in an oil-cooled transformer, the transformer terminal voltages, the winding currents, and the ambient temperature are measured and the status of fans and pumps and the switch position of a tap changer are established. The measured and established variables are fed to a thermo-hydraulic model, in which status variables are calculated using auxiliary variables, which are losses in the transformer, heat transfer parameters, flow resistances, and the oil flow, and a hydraulic network of the oil circuit, which has branches and nodes. The status variables are the average temperatures and hotspot temperatures in loss-generating transformer parts and the average oil temperatures in branches and in nodes of the hydraulic network of the oil circuit.

SUMMARY OF THE INVENTION

It is an object of the present invention to specify a method of the type mentioned at the outset which enables more reliable aging assessment and in particular differentiation between a normal and a faulty operation of an electrical device having an insulation system made up of solid insulation arrangement and liquid or gaseous insulating medium and thus enables particularly reliable operation.

With the above and other objects in view there is provided, in accordance with the invention, a method for aging assessment, in particular status monitoring, of an electrical device having a solid insulation arrangement and a liquid and/or gaseous insulating medium in contact with the solid insulation arrangement. The method comprises the following steps:

- S1) providing a thermo-hydraulic aging model of the electrical device and carrying out a simulation for the electrical device using the aging model;
- S2) within a scope of the simulation for the electrical device calculating local temperatures for various areas of the electrical device, and calculating local aging variables for the various areas of the solid insulation arrangement in consideration of the local temperatures and optionally further aging-determining influencing variables;
- S3) calculating amounts of at least one aging product, which arises due to an aging of the solid insulation arrangement and passes into the insulating medium, for the various areas of the solid insulation arrangement in consideration of the calculated local temperatures and/or, if calculated in step S2, the local aging variables and with additional consideration of masses of the solid insulation arrangement, and using the calculated aging product amounts to distinguish between a normal status and a faulty status of the electrical device.

In other words, the above objects are achieved by a method for aging assessment and in particular status monitoring of an electrical device comprising a solid insulation arrangement and a liquid and/or gaseous (i.e., fluid) insulating medium in contact with the solid insulation arrangement. The electrical device, in a preferred embodiment of the invention, is a transformer or a choke, and the method includes:

S1) a thermo-hydraulic aging model of the electrical device is provided and/or created and a simulation for the electrical device is carried out using the aging model;

S2) in the scope of the simulation, local temperatures are calculated for various areas of the electrical device, in particular for various areas of the solid insulation arrangement and/or for various areas of the volume occupied by the insulating medium, preferably, wherein local aging variables, in particular local DP numbers, are calculated for various areas of the solid insulation arrangement in consideration of the local temperatures and optionally further aging-determining influencing variables, in particular the local humidity and/or the oxygen content of the insulating medium; and S3) amounts of at least one aging product, which arises due to the aging of the solid insulation arrangement and passes into the insulating medium, are calculated for the various areas of the solid insulation arrangement in consideration of the calculated local temperatures and/or, if calculated in step S2, the local aging variables and preferably with additional consideration of masses of the solid insulation arrangement, preferably, wherein the calculated aging product amounts are used to distinguish between a normal and a faulty status of the electrical device.

The calculated aging product amounts are expediently used to distinguish between a normal and a faulty status of the electrical device.

It has proven to be particularly expedient if simulation results of a comparison are subjected to metrologically detected values. It is thus provided in one advantageous embodiment that a comparison of the aging product amounts calculated in step S3, in particular a sum of calculated aging product amounts, to one or more aging product amounts metrologically detected on the electrical device takes place and a distinction is made between a normal status and a faulty status of the electrical device on the basis of the comparison result.

In other words, the core concept of the present invention is to calculate the (location-dependent) generation and the distribution of one or more aging products, which arise in the course of operation in an insulation system made up of solid insulation, such as paper, and a liquid and/or gaseous insulating medium, such as oil, and in particular pass from the solid insulation into the insulating medium and/or arise in the insulating medium itself ("aging marker") by means of a simulation model. It is expediently then concluded on the basis of the/a simulation result or a part of such a result whether a faulty or normal operation of the electrical device is present. The aging product or products can be metrologically detected in a comparatively simple manner on a real electrical device, for example, by taking a sample of the insulating medium, such as oil. A comparison between simulation values and measured values is thus possible and informative, more reliable conclusions can be drawn about the status of the electrical device.

A simulation of internal processes in the electrical device expediently takes place. Operation of the electrical device can also be simulated.

In the scope of the invention, local temperatures are calculated here for various areas or points of the electrical device, in particular for various parts thereof. A network calculation of the temperatures in an electrical device, such as a transformer or a choke, preferably takes place. The local temperatures are expediently taken into consideration in the optional determination of the local aging variables, for example, are incorporated in equations which are used for calculating aging variables.

In a particularly expedient embodiment of the method according to the invention, the thermo-hydraulic aging model is accordingly designed as a network model, in particular as a network model for a network calculation of local temperatures at various points/areas of an electrical device, such as a transformer.

Furthermore, the network model is preferably designed in order to calculate the redistribution of the local aging product generation, such as $CO_2$ contributions, on all areas or points or parts of the solid insulation arrangement using it or in it, in order to come into equilibrium in the overall system.

For example, the local insulation having the highest $CO_2$ generation rate does not automatically also have to have the highest specific $CO_2$ content. In other words: by using a network model, these balancing processes can be computed, in that the flowing medium, such as insulating oil, as the transport medium for $CO_2$, for example, connects the local positions of the solid insulation arrangement to one another. An exchange of $CO_2$, for example, takes place here in order to achieve an equilibrium between local insulation arrangement and surrounding insulating medium. This exchange can take place in both directions—for example, from the oil into the cellulose and vice versa—since the storage capacity of the aging product or products, such as $CO_2$, is generally not negligibly small in the solid insulation arrangement, such as cellulose. From the local values of the at least one aging product dissolved in the insulating medium, such as $CO_2$ dissolved in oil, an aging product content in the overall insulating medium can be obtained, a value which is metrologically accessible. The network model is expediently designed accordingly.

Instead of an empirical assessment, a more systematic judgment of an aging status and in particular a monitoring of an aging status takes place. The performance of simulation models is developed in that an assessment of individual parts takes place instead of integral statements. The application of a thermo-hydraulic temperature model is expanded. In particular due to the aging simulation via the calculation of local DP number, which generally cannot be checked using a direct measurement, a link to the measured values of these aging products in the insulating medium, such as oil, results due to the calculation according to the invention of the aging products.

An assignment as to whether a metrologically observed amount is in accordance with the operation or there is a suspicion of faulty behavior in the device is possible. Variables influencing the aging process and the spatial characteristics thereof, in particular the temperature distribution, moisture distribution, and local generation of aging products derived therefrom, as well as optionally local DP number distribution, in particular with associated insulation masses, are taken into consideration here by the simulation taking place according to the invention.

In one preferred embodiment, in step S3, amounts of 2-FAL and/or $CO_2$+CO are calculated as aging product amounts by means of the thermo-hydraulic aging model.

These variables represent particularly suitable "aging markers", which can be observed in the scope of the method according to the invention. On the other hand, these variables may also be detected well metrologically in an insulating medium. In general, 2-FAL primarily becomes visible when significant aging is already present, while $CO_2$+CO already arises at the beginning.

In the calculation of the aging product amounts for the various points or areas of the solid insulation arrangement, in particular various parts thereof, the masses of the various areas or parts of the insulation arrangement are expediently taken into consideration. This is because the aging products passing from the solid insulation arrangement or parts thereof into the insulating medium are generally dependent on the (respective) mass.

The insulating medium expediently has both insulating and cooling properties, in other words it is used in particular both for insulating and also cooling.

The thermo-hydraulic aging model used according to the invention is preferably designed having multiple steps or can comprise multiple sub-models. It includes in particular:

- the calculation of the electrical power losses in the various parts of the electrical device (e.g., transformer, choke, etc.) on the basis of the applied voltage and the current,
- the calculation of dynamic local temperatures in different parts of the insulation system comprising the solid insulation arrangement and the liquid or gaseous insulating medium,
- (optionally) the calculation of the aging of the solid insulation arrangement, if cellulose-based in particular the cellulose aging, which is typically expressed via the DP number, at different points/parts of the solid insulation arrangement on the basis of the local temperatures thereof and preferably (further) aging-determining influencing variables, such as oxygen and local humidity,
- the calculation of the generated aging products as a result of the insulation aging in particular by inspection of the DP numbers at different parts of the solid insulation in consideration of the masses thereof.

The acronym "DP" in the term "DP number" stands for "degree of polymerization." It is in particular a measure of the decreasing length of cellulose molecules due to thermal aging, by which the mechanical strength is impaired, which can result in an operating risk. The DP number indicates a number of base molecule units in a cellulose chain which forms due to polymerization, the concatenation of the base molecule. New cellulose has DP values of greater than 1000, while the chains decompose into shorter units due to chemical decomposition, which reduces their mechanical strength. At DP values less than 200, the mechanical strength, such as the tensile strength, is significantly worsened, it is significantly below 50% in relation to the starting status, which could endanger the safe operation of a transformer, in particular in the event of short-circuits in the network, which at least temporarily result in large currents and thus straining forces or oscillations.

For the optional calculation of DP numbers as aging variables, in particular the calculation of the DP number decreasing due to aging, at least one formula is preferably used which comprises as influencing variables the starting status DP Start, the period of time t, the temperature h of the solid insulation, in particular cellulose, in the hotspot, and a material property A of the cellulose, which is dependent on $H_2O$ and O and the cellulose quality. In papers, there is a thermo-stabilized quality having reduced thermal aging at high temperatures as a second cellulose quality. In this regard, reference is also made to the norm IEC 60076-7: 2018 "Loading guide for mineral-oil-immersed power transformers", 2018, and therein in particular to page 42 having equation A.1 there and table A.1 on page 43, the parameters of which take into consideration the temperature, moisture, cellulose quality, and oxygen influence in a simple manner.

The thermo-hydraulic aging model used according to the invention can comprise at least one such equation.

Alternatively or additionally, it can be provided that the following equation is used for the optional calculation of local DP numbers in step S2:

$$DP_t = \left[DP_{t-1}^{1-p(T)} + O_t \cdot M_t \cdot \Delta t \cdot (p(T) - 1)\right]^{\frac{1}{1-p(T)}}$$

Therein, $M_t$ is a moisture factor, p(T) is a temperature function, and $O_t$ is an oxygen factor, which strongly influence the DP drop according to the equation.

The following preferably applies for the temperature function:

| Non-thermo-stabilized paper and cellulose | Thermo-stabilized paper |
|---|---|
| $p(T) = 1.182455 \cdot e^{0.005791 \cdot T}$ | $p(T) = 1.024508 \cdot e^{0.006021 \cdot T}$ |

In a further advantageous embodiment, the following equation is used for the oxygen factor:

$$O(T, \text{ppm}) = 1 + (O_T - 1) \cdot O_{ppm}/O_{sat},$$

with $O_{sat}$=37 000 ppm (<1000 m sea level, in mineral oil) and $O_{ppm}$ equal to the oxygen concentration present in the transformer.

Without measurement, it is possible in particular to proceed from two possibilities:

- open system having oxygen which is resupplied from air,
- closed system having little oxygen.

The electrical device is preferably designed closed, in particular is given by a system or device having air exclusion.

The thermo-hydraulic aging model is expediently designed to calculate both the steady-state behavior and the transient behavior of the following variables, in particular based on the load:

The heat flow and the temperature of components or areas of the electrical device (in the case of a transformer in particular of the insulating medium, such as oil, in the upper and lower area of the tank or the cooler, core temperatures, temperatures of winding parts, and the local hotspots (hot point locations) and local oil temperatures in the windings).

The oil flow in the electrical device or in components thereof (in the case of a transformer in the core, the windings, in the tank, etc.), which is determined by the hydraulic resistance, the buoyancy, and optionally the pump pressure.

Furthermore, the model is preferably designed to calculate the following variables with respect to the moisture and the aging behavior:

- The moisture exchange between solid insulation and liquid or gaseous insulating medium, preferably including a possible moisture exchange with the atmosphere by diffusion of moisture to the outside, in a transformer in particular through the oil expanding container (conservator).
- Calculation of the local aging variable, in particular degree of polymerization (DP value) of the various areas or cellulose elements in consideration of:
  - the influence of moisture and oxygen the quality of the solid insulation, in particular the cellulose quality (such as thermally non-stabilized or thermally-stabilized (thermally upgraded) paper)

the moisture formation due to the aging itself

Influence of the aging (DP value) on the moisture absorption of the solid insulation, in particular cellulose, and Risk of bubble formation when the pressure of dissolved gases and moisture in the solid insulation or the insulating medium exceeds the ambient pressure loading thereon. This can result in the destruction of the device.

In the scope of the present invention, in particular an expanded version of that thermo-hydraulic aging model can be used which is disclosed in the article "Simulation of long-term transformer operation with a dynamic thermal, moisture and aging model", 5th International Colloquium on Transformer Research and Asset Management, October 2018, Opatija, Croatia (further publication of the article: 5th International Colloquium on Transformer Research and Asset Management, Lecture Notes in Electrical Engineering, vol 671, Springer, Singapore, 2020, https://doi.org/10.1007/978-981-15-5600-5_17). This simulation model can be or become expanded such that it additionally enables or comprises a calculation of the aging product amounts according to step S3, which arise due to the aging of the solid insulation arrangement (2-FAL and/or $CO_2$+CO) and pass into the insulating medium and assume an equilibrium status in the overall system via the propagation through the insulating medium, from which a value uniform in the entire insulating medium results of the aging product dissolved in the insulating medium, the aging marker (2-FAL, $CO_2$+CO, . . . ).

Input variables for the thermo-hydraulic aging model can be, for example, among other things, the ambient temperatures during the observed operating period and the load. In an expedient embodiment, furthermore the switch position, cooling level, and/or the present voltage form input variables for the thermo-hydraulic aging model.

It can be provided that in step S3, in the calculation of the aging product amounts for the various areas of the solid insulation arrangement, in each case the equilibrium status, in particular of the respective aging product or products, between solid insulation arrangement and insulating medium is taken into consideration, preferably in consideration of the increase of the respective aging product or products due to aging and the mixing of the respective aging product or products, in particular in the entire insulating medium. This is in particular the case to determine the absorption of the at least one aging product in the insulating medium.

In other words, the calculation of the aging product amounts can take place at local areas or parts of the solid insulation arrangement, where the equilibrium status of the substance or the aging product between local solid insulation arrangement and local insulating medium is taken into consideration, in consideration of the increase of the respective aging product or products due to aging and the mixing of the respective aging product or products in particular in the entire insulating medium.

A balancing process can thus be taken into consideration, in particular the mixing/redistribution by the transport in the insulating medium. The calculation of the local balance between local solid insulation arrangement or areas/points thereof and local insulating medium is determined in particular by two effects: the increase of the respective aging product or products due to aging and the change due to the transport in the liquid or gaseous insulating medium, wherein instead of the iterative change due to the transport, a simplification results by an immediate transfer into the entire insulating medium, due to which, for example, the specific aging product value absorbed in the hotspot does not have to correspond to the high specific generation rate of the aging product, vice versa, areas/point/parts having less aging obtain elevated aging values than those corresponding to their aging.

An integral value can be formed from the calculation of local aging product equilibria. The aging model is preferably designed accordingly.

Expediently, the equilibrium status is at least roughly known and is accordingly taken into consideration. In the simplest approach, a constant, temperature-independent ratio value can be used for the distribution between solid insulation and insulating medium, in that the vapor pressure in solid insulation and insulating medium have the same temperature dependence, so that the ratio thereof is not temperature dependent. This simplified assumption is not given in the case of the vapor pressure of water dissolved in cellulose and oil. The moisture shifts upon rising temperature into the insulating medium there. The thermo-hydraulic aging model used is or will be expediently designed accordingly.

Alternatively or additionally, in the calculation of the aging product amounts in step S3, a redistribution of the aging products from points having a higher generation rate to points having a lower generation rate, in particular via a transport through the insulating medium, can be taken into consideration. That the thermo-hydraulic aging model used is or will be expediently designed accordingly is also true here. This effect is dependent in particular on the specific solubility properties of the respective aging product or products in the different areas of the insulation arrangement and the insulating medium.

In a further preferred embodiment, it is provided that in step S3, the calculation of the aging product amounts is carried out using at least one formula which is or was created on the basis of metrologically detected data, in particular on the basis of metrologically detected data which link a decreasing DP number with an increasing amount of at least one aging product, preferably $CO_2$+CO and/or 2-FAL. 2-FAL stands here for 2-furfural (furan-2-carbaldehyde), a compound particularly informative in practice from the family of cellulose decomposition products.

In other words, these can in particular be one or more formulas which is or was created using measurement data and link aging variables of a solid insulation, in particular DP numbers, with amounts of at least one aging product passing into an associated insulating medium. The DP number decreases with increasing age and the aging product amount(s) increases.

It is to be noted that other aging products also exist, such as methanol. However, these are generally not stable and will be decomposed further. The use of these unstable substances would thus additionally increase the degree of complexity. In all cases, however, $CO_2$+CO is to be found at the end. In general, the proportion of CO, which indicates oxygen depletion during the decomposition process, is dependent on the decomposition conditions such as temperature and rapidity of a temperature increase. The solubility properties of CO in oil are also worse than those of $CO_2$. Metrologically, $CO_2$ and CO are expediently detected separately.

Solely by way of example, it is to be noted that on a real electrical device, such as a transformer having oil-filled tank and cellulose-based solid insulation arrangement, or an associated representative measurement setup, in particular at multiple spaced-apart points in time, both the DP numbers of the solid insulation (arrangement) and amounts of aging products which have passed over, such as $CO_2$+CO and/or 2-FAL, are or were metrologically detected in the oil. Corresponding measurement data can be plotted in a graph, for example, and at least one associated fit function can be determined, which can then be incorporated as the at least one formula in the simulation model. Corresponding measurement data can be or have been created separately for the creation of the simulation model. Alternatively or additionally existing measurement data can be used. Solely by way of example, reference is made to the article "Diagnosis of Thermal Degradation for Thermally Upgraded Paper in Mineral Oil" by Naoki Yamagata et al., 2008 International Conference on Condition Monitoring and Diagnosis, Beijing, China, Apr. 21-24, 2008, which shows, for example, in FIG. 8 a graph in which for two different types of paper, the (average) DP number (in percentage of the starting value) is plotted over the amount of $CO_2$+CO (ml/$g_{Paper}$) passing into the oil. Associated fit lines are also shown. Accordingly, laboratory measurement results are present for a correlation of "$CO_2$+CO generation per gram of paper" to the DP number. These are measured values based on a mass having a single temperature (1-mass model). This is inadequate for an electrical device, such as a transformer. In the scope of this embodiment of the present invention, these measurement results are incorporated into a network model in order to describe the complexity of an electrical device, such as a transformer (multi-mass model, balancing processes).

For a correlation between DP number and 2-FAL, absorbed in the insulating medium, such as oil, a modified version, in particular at least one modified equation, of the so-called "De Pablo model" can be used, for example. The main equation of this model is given by De Pablo:

$$[2FAL\,(\mu g/g\text{ paper})] = ((10^6 * ((DP_0/DP_t) - 1))/162 * DP_0) * 96 * 0.3 * 1.2$$

Where: $DP_0$ is the initial DP number, $DP_t$ is the DP number at an arbitrary point in time during the aging, "g paper" is the insulation mass, 162 is the molecular weight of glucose units, 96 is the molecular weight of furfural, $10^6$ the correction factor of g to □g, 0.3 is the reaction yield, and 1.2 is the furfural absorption correction of the solid insulation.

For the "De Pablo model," reference is also made to the CIGRE reference paper "The Condition of Solid Transformer Insulation at End-of-Life", CIGRE ELECTRA No. 321, April 2022, by Christoph Krause et al., therein in particular to page 4 and equations (1) to (3) therein with associated explanations.

In a preferred refinement of the method according to the invention, the above De Pablo equation (corresponding to the equation (3) on page 4 of the cited CIGRE reference paper) is used, but without the factor 1.2 at the end, thus $$[2FAL\,(\mu g/g\text{ paper})] = ((10^6 * ((DP_0/DP_t) - 1))/162 * DP_0) * 96 * 0.3,$$

in order, in step S3, to calculate amounts of 2-FAL as the at least one aging product. This is done since the factor 1.2 represents a generalized conversion to the DP value in the hotspot with a lack of transformer-specific information.

The insulating medium is liquid or gaseous. The insulating medium can comprise an oil or can be given by an oil, such as mineral oil. A gas as an insulating medium is also possible. SF6 is mentioned solely by way of example as an insulating gas which can be provided or observed or simulated as an insulating medium. It is also possible that a vacuum is used or simulated as a (gaseous) insulating medium. For the sake of completeness, it is to be noted that a gas transfer and transport to other points, in other words a redistribution of aging products, is also possible under vacuum conditions.

The solid insulation arrangement can furthermore comprise cellulose, in particular paper and/or pressboard, or can be given by cellulose, in particular paper and/or pressboard. In particular paper can be provided here in different qualities, for example, thermo-stabilized and non-thermo-stabilized.

With other materials, the material-dependent properties are expediently determined in a laboratory. In the case of aramid, a high temperature plastic, for example, the formation of $CO_2$ or other decomposition products which could be suitable as aging markers is hardly perceptible using current knowledge. However, data exist to be able to estimate the aging as such on the basis of the decreasing mechanical strength.

Cellulose and pressboard can also have other materials admixed, in particular those which ensure receiving a higher thermal class.

It can also be provided that different areas of the solid insulation arrangement, in particular different parts thereof, are designed differently, for example, are distinguished by various material qualities.

Instead of the DP number of cellulose, alternatively-without prior formation of a DP number—the generation of substances which are also usable as aging markers, in particular aging product amounts, could also be calculated on the basis of the time information, in particular a time profile, which can depend on multiple parameters, such as temperature, moisture, etc. [$CO_2$+CO measurement results versus time: see the above-mentioned Japanese paper by Naoki Yamagata et al.].

Aging products, such as $CO_2$ and CO, can also be produced in the insulating medium itself. In general, this proportion is significantly less than the contribution from the solid insulation.

In a refinement of the method according to the invention, it can be provided that the electrical device comprises a tank filled with the insulating medium, in which components of the electrical device are arranged, wherein one or more of the components are provided with the solid insulation arrangement, in particular are wrapped using the solid insulation arrangement or parts thereof. A transformer, for example, generally comprises multiple components arranged in a tank filled with oil, for example, which are each provided with the/a solid insulation, such as pressboard (cellulose) and/or paper. In the case of paper, the affected components are in particular wrapped therewith. Core, windings, and other adjoining parts are mentioned solely by way of example for such components.

The solid insulation provided overall can thus also comprise multiple parts or partial insulations for the multiple components, because of which reference is also made in the present case to a solid insulation arrangement. If the solid insulation arrangement is in multiple parts, two or more of the insulation parts can accordingly also be arranged spaced apart from one another.

If the solid insulation arrangement is in multiple parts, in step S2, the various areas of the solid insulation arrangement can comprise various parts of the solid insulation arrangement or can be given thereby. Various components of the electrical device are then preferably assigned various parts of the solid insulation arrangement. It can be in particular that various components of the electrical device are provided, for example, also wrapped with various parts of the solid insulation arrangement.

For example, in step S2, local temperatures and in particular local aging variables, such as DP numbers, are calculated for various parts of the solid insulation arrangement, for example for the part of the solid insulation arrangement located on the windings, for an insulation part of at least one spacer, the insulation part of at least one pressure ring, and the insulation part of at least one mounting plate.

The aging variables are those which represent an aging process of the insulation or are connected to an aging process of the insulation, which change in particular due to at least one occurring aging process. In other words, it can be a variable representing or indicating the progressing aging of the insulation. In cellulose, for example, this is the DP number decreasing with progressing time, thus increasing age, which was described in more detail above.

In step S2, in the optional calculation of the aging variables for the various areas/parts of the solid insulation, further aging-determining influencing variables can preferably be taken into consideration in addition to the temperature distribution, in particular a moisture distribution. For example, local temperatures and local moisture values can be calculated for various areas/parts, in particular of the solid insulation arrangement of the electrical device. The influence of the moisture on the aging is thus also taken into consideration.

In step S2—in consideration of the local temperatures and in particular moistures—aging variables can be calculated. In a refinement, multiple DP numbers are determined for each of the various areas/parts as the aging variables for a predetermined period of time. In other words, the DP numbers decreasing with progressing time and therefore increasing age of the solid insulation arrangement are preferably determined, this is in particular for various areas/parts of the solid insulation arrangement. Particularly preferably, in step S2, aging variables, in particular DP numbers, are calculated for a period of time of multiple hours or days or multiple months or even multiple years.

It can also be provided that in the scope of the simulation or the thermo-hydraulic aging model, parts of the solid insulation are assumed in simplified form as blocks.

In the course of technical refinement, the trend toward mixing different insulation qualities increases. The use of thermo-stabilized papers in the winding insulation having their thermal hotspots is thus greater in the US industry than in 30 years of prior art. However, in the routine assessment method, it is not taken into consideration that this cellulose quality assumes a completely different behavior in the 2-FAL production in relation to the large residual mass of non-thermo-stabilized cellulose. The 2-FAL formation during aging is extremely reduced. The trend toward mixing different materials, such as aramid, increases to use higher thermal heat classes than that of cellulose—see also IEC 60076-14:2014. The use of empirical adaptation factors therefore becomes more and more unfavorable. The use according to the invention of a network model for taking into consideration local individual material properties is also particularly advantageous here.

A further embodiment of the method according to the invention is distinguished in that a simulation of the operation takes place for a simulation period of time of multiple months, in particular multiple years. In other words, a long-term simulation for the electrical device is carried out in the scope of the method according to the invention. It is to be noted that the actual computing time required for carrying out such a simulation ("real-time"), can naturally significantly fall below the time spans which the simulation covers (simulation time), and in general will significantly fall below them.

In addition, it is to be noted that in the case of extreme overloads or extremely rapidly changing loads, a simulation for short times, for example, in the order of magnitude of hours, can also be of great interest. The risk of bubbling, the formation of gas bubbles in the high-voltage range, is particularly high here.

A further subject matter of the present invention is a computer program comprising program code means which, upon the execution of the program on at least one computer, prompt the at least one computer to carry out the steps of the method according to the invention.

The computer program can be designed to accept one or more values of aging product amounts metrologically detected on the electrical device, in order to perform a comparison thereof to the aging product amounts calculated in step S3.

In addition, the invention relates to a computer-readable medium comprising instructions which, when they are executed on at least one computer, prompt the at least one computer to carry out the steps of the method according to the invention.

The computer-readable medium can be for example a CD-ROM or a DVD or a USB or a flash memory. It is to be noted that a computer-readable medium is not to be understood exclusively as a physical medium, but can also be present, for example, in the form of a data stream and/or a signal that represents a data stream.

Other features which are considered as characteristic for the invention are set forth in the appended claims.

Although the invention is illustrated and described herein as embodied in a method for aging assessment and in particular status monitoring, computer program, and computer-readable medium, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
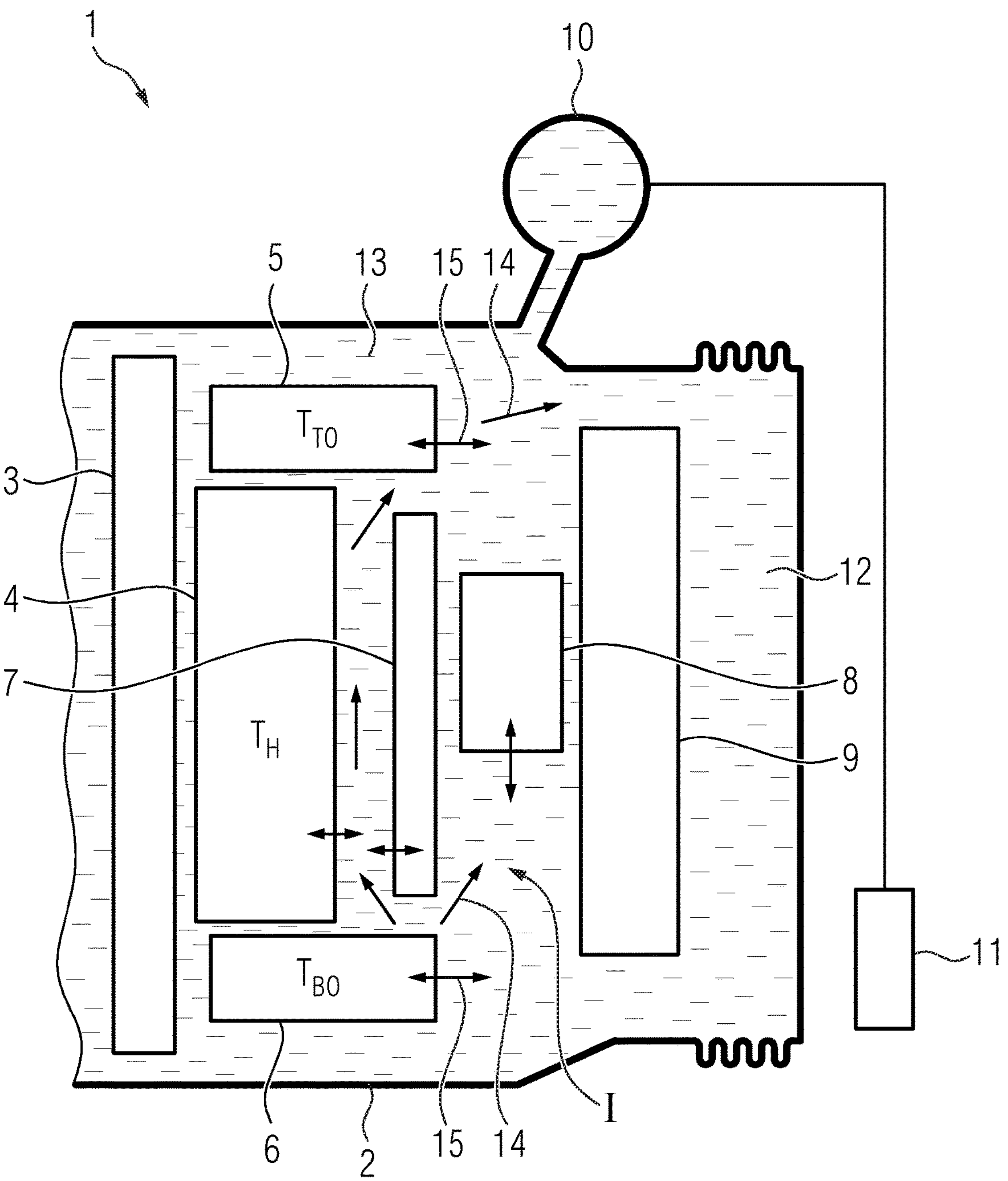
FIG. 1 is a highly schematic partial representation of a transformer.

FIG. 1 shows a greatly simplified, highly schematic partial representation of an electrical device in the form of a transformer 1.

The transformer 1 comprises a tank 2, only shown in a portion in the figure, in which multiple components of the transformer 1 are arranged. In FIG. 1, inter alia, a core 3, a winding arrangement 4, a press ring 5, a mounting plate 6, and a winding cylinder 7 can be seen thereof. The transformer 1 has a solid insulation arrangement I, which predominantly comprises or consists of pressboard and paper, thus cellulose, and is formed in multiple parts. As an example, the widespread core construction of a power transformer was selected, the active part of which comprises the winding arrangement 4 extending around the iron core 3, the conductors of which are insulated by pressboard elements (cellulose), wherein the conductors are typically wrapped with papers (cellulose). On the one hand, the pressboard elements and papers associated with the winding arrangement 4 are part of the solid insulation arrangement I. This also applies to the press ring 5, the mounting plate 6, and the winding cylinder 7, each of which consists of one or more pressboard elements.

The block element provided with the reference numeral 8 in FIG. 1 is representative of further areas or parts of the insulation arrangement I which can be provided or are provided in the present case, in particular further cellulose, also for/on further components of the transformer 1 outside the active part. All paper or pressboard parts which are located at or on the various components together form the solid insulation arrangement I.

An "empty space" present in the tank 2, i.e., a recess or a hole, is indicated by 9. Furthermore, a conservator, in other words an oil expansion tank 10, an air dehumidifier 11, and a cooler 12 are schematically shown. The empty space 9 is located between the cooler 12 and the remaining area of the tank 2. There are expansion tanks in open construction which permit the access of air. However, the trend toward closed systems—for example by means of a rubber membrane—is increasing in order to prevent the access of aging-accelerating oxygen.

The tank 2 is furthermore provided in the illustrated exemplary embodiment with a liquid insulating medium in the present case, which is provided by a mineral oil 13. This can also be referred to as an oil-insulated transformer 1. The solid insulation arrangement I and the oil 13 together form an insulation system of the transformer 1.

The solid insulation arrangement I is in contact with the insulating oil 13. Substances which arise due to the aging of the solid insulation arrangement I, pass into the insulating medium 13, and can be detected there are also designated as "aging markers". Solely by way of example, $CO_2$+CO and/or 2-FAL are mentioned as such "aging markers".

The oil flow is indicated in FIG. 1 by single arrows, which are provided by way of example with the reference sign 14. Furthermore, double arrows 15 solely schematically indicate the moisture exchange between solid insulation arrangement I and liquid insulating medium 13.

An improved assessment of the aging status and thus better status monitoring of the operation of the transformer 1 is possible with performance of the exemplary embodiment of the method according to the invention described hereinafter.

In step S1, a thermo-hydraulic aging model (acronym: THAM) 16 (see FIG. 2) is provided and/or created for the transformer 1 and a simulation is carried out for the transformer 1 using the aging model 16, in particular for a simulation period of time of multiple months or years. Internal procedures or processes in the transformer 1 are simulated here. The simulation can take place in a way known per se using at least one computer.

In the present case, an expanded version of that thermo-hydraulic aging model is used which is disclosed in the article "Simulation of long-term transformer operation with a dynamic thermal, moisture and aging model", 5th International Colloquium on Transformer Research and Asset Management, October 2018, Opatija, Croatia.

Figure 2:
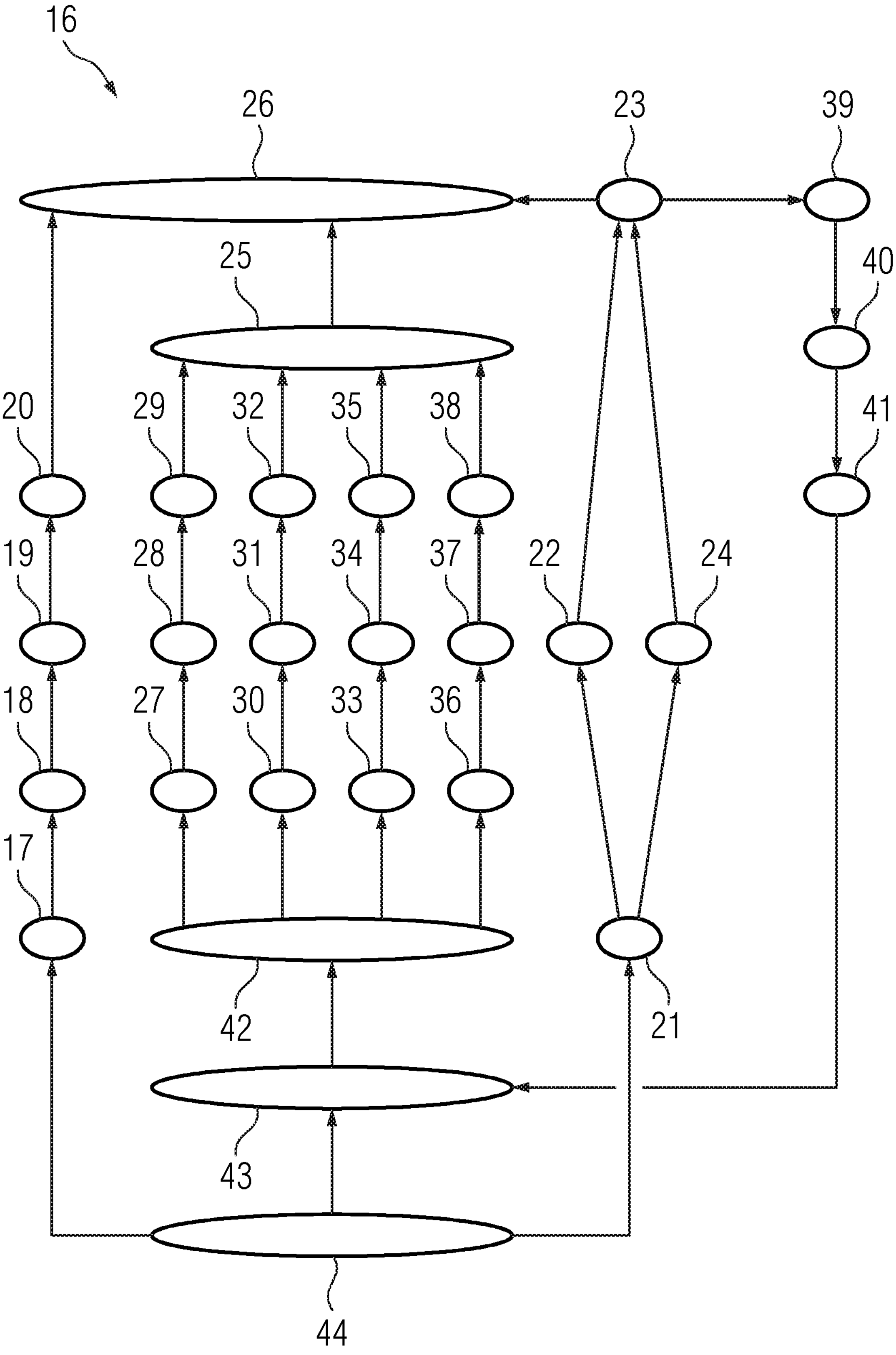
FIG. 2 shows a schematic representation of a thermo-hydraulic aging model for the transformer from FIG. 1.

The various components or aspects of the transformer 1 shown in FIG. 1 including the oil flow are modeled by various branches having specific properties, which are connected by nodes, in order to obtain a thermal network model. An exemplary arrangement of branches and nodes for the main components of the transformer 1 is shown in FIG. 2. In this case, the nodes 17-20 represent the core 3, the nodes 21-23 represent the majority of the oil 13 in the tank 2 ("tank bulk oil"), the nodes 21, 24, and 23 represent the wall of the tank 2, the node 25 represents the flow together of the oil 13 from the underlying components, the node 26 represents the oil 13 in the upper area of the tank 2 ("top oil"—the resulting hot oil) and the membrane of the conservator 10, the node 23 represents the oil 13 in the upper area of the tank 2 including the seals, the nodes 27-38 represent the transformer windings, and the nodes 39-41 represent the cooler element. The nodes 42 to 44 show by way of example a special construction of the oil supply to the windings of the winding arrangement 4. The branches are indicated in FIG. 2 by arrows which connect the nodes 17-44.

In the scope of the simulation using the aging model 16, local temperatures are calculated in step S2 for various areas of the electrical device 1, here for various parts of the solid insulation arrangement I and in particular areas of the oil 13, these temperatures resulting with a time delay, thus dynamically, via the electrical losses generated from current and voltage. FIG. 1 indicates that the press ring 5 has the temperature $T_{TO}$ of the oil 13 in the upper area of the tank 2 ("top oil"), the winding arrangement 4 having the windings and pressboard spacers has the hotspot temperature TH, and the mounting plate 6 has the temperature $T_{BO}$ of the oil 13 in the lower area ("bottom oil").

In step S2, local aging variables, specifically local DP numbers, are furthermore calculated for various areas of the solid insulation arrangement I, here for various insulation parts. The calculation is carried out here in consideration of the determined local temperatures and further aging-determining influencing variables, namely the oxygen and the local humidity. The calculation of local aging variables comprised in the present exemplary embodiment is optional.

In step S3, amounts of at least one aging product, which arises due to the aging of the solid insulation arrangement I and passes into the insulating medium 13, are calculated for the various areas/parts of the insulation arrangement I, in the present case in consideration of the local DP numbers obtained in step S2, and in particular masses of the insulation arrangement I.

The thermo-hydraulic aging model 16 is designed here to calculate the following variables with respect to the moisture and the aging behavior:

- The moisture exchange between solid insulation arrangement I and insulating medium 13, including a possible moisture exchange with the atmosphere.
- Calculating the local aging variables, in particular the degree of polymerization (DP value), of various areas/parts of the cellulose insulation I, in particular the hotspot in consideration of:
  - the influence of moisture and oxygen
  - the cellulose quality (for example, non-thermo-stabilized or thermo-stabilized paper)
  - the moisture formation due to the aging itself
- Influence of the aging (DP value) on the moisture absorption of the cellulose, and
- Risk of bubble formation when the pressure of dissolved gases and moisture in the insulating medium 13 exceeds the ambient pressure loading thereon. This pressure or the temperature is additionally to be somewhat elevated here to be able to overcome the boundary surface tension of the liquid to form a gas bubble in the insulating oil 13.

Aging results in worsening of the mechanical strength of the cellulose or the tensile strength of the paper. Sinking of the tensile strength to below 40% of the starting value is often viewed as a risky state with regard to the short-circuit resistance. Instead of the measured tensile strength, the average length of the cellulose fibers, the degree of polymerization (DP value or DP number), is a routine variable for describing the status of the cellulose. Tensile strengths of approximately 40% correlate with DP values of approximately 200. New transformers generally have DP numbers of greater than 900. The aging model 16 calculates the decrease of the DP value in each modelled solid insulating part 4-8 of the transformer 1 according to FIG. 1.

Preferably the following equation is used for the calculation of the local DP numbers:

$$DP_t = \left[DP_{t-1}^{1-p(T)} + O_t \cdot M_t \cdot \Delta t \cdot (p(T) - 1)\right]^{\frac{1}{1-p(T)}}$$

Therein, $M_t$ is a moisture factor, p(T) is a temperature function, and $O_t$ is an oxygen factor, which strongly influence the DP drop according to the equation.

The following applies for the temperature function:

| Non-thermo-stabilized paper and cellulose | Thermo-stabilized paper |
|---|---|
| $p(T) = 1.182455 \cdot e^{0.005791 \cdot T}$ | $p(T) = 1.024508 \cdot e^{0.006021 \cdot T}$ |

The following equation is used for the oxygen factor:

$$O(T, \text{ppm}) = 1 + (O_T - 1) \cdot O_{ppm}/O_{sat},$$

with $O_{sat}$=37 000 ppm (<1000 m sea level, in mineral oil) and $O_{ppm}$ equal to the oxygen concentration present in the transformer.

Figure 3:
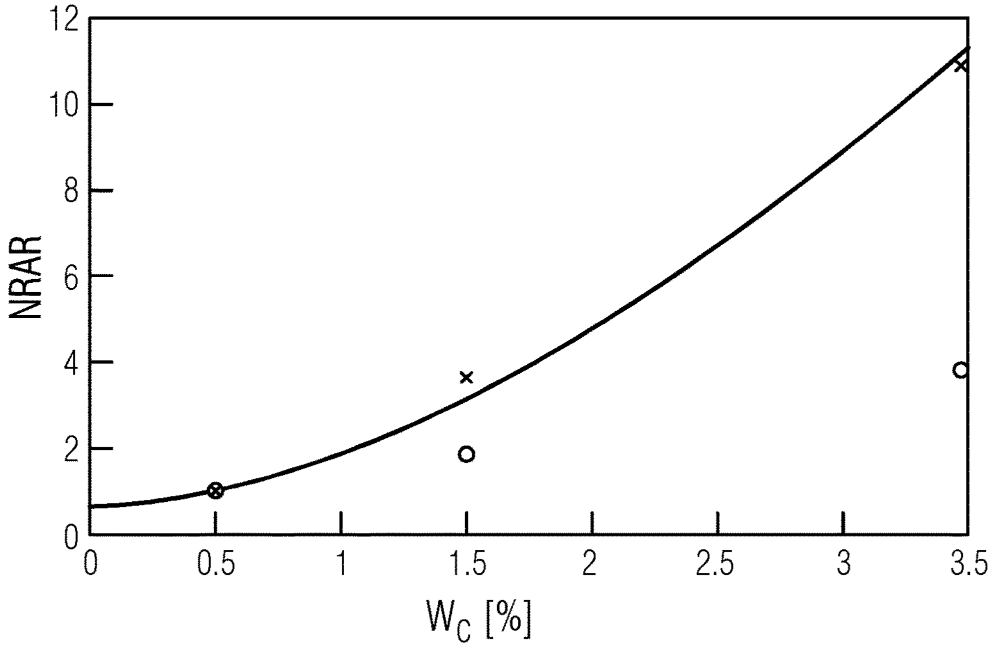
FIG. 3 shows a graph in which the scaled relative aging rate is plotted over the moisture content in cellulose.

The graph according to FIG. 3 furthermore shows the influence of the moisture on the relative aging rate. The normalized relative aging rate (NRAR-$M_t$-factor normalized to 1 at 0.5% moisture) is plotted over the moisture in cellulose $W_C$ in %. The solid line corresponds here to values calculated using the aging model 16, while the crosses and dots represent values according to IEC 60076-7:2018, the crosses for non-thermostabilized paper and the dots for thermostabilized paper. As can be seen, the normalized relative aging rate increases with increasing moisture of the solid insulation arrangement I, cellulose here.

Figure 4:
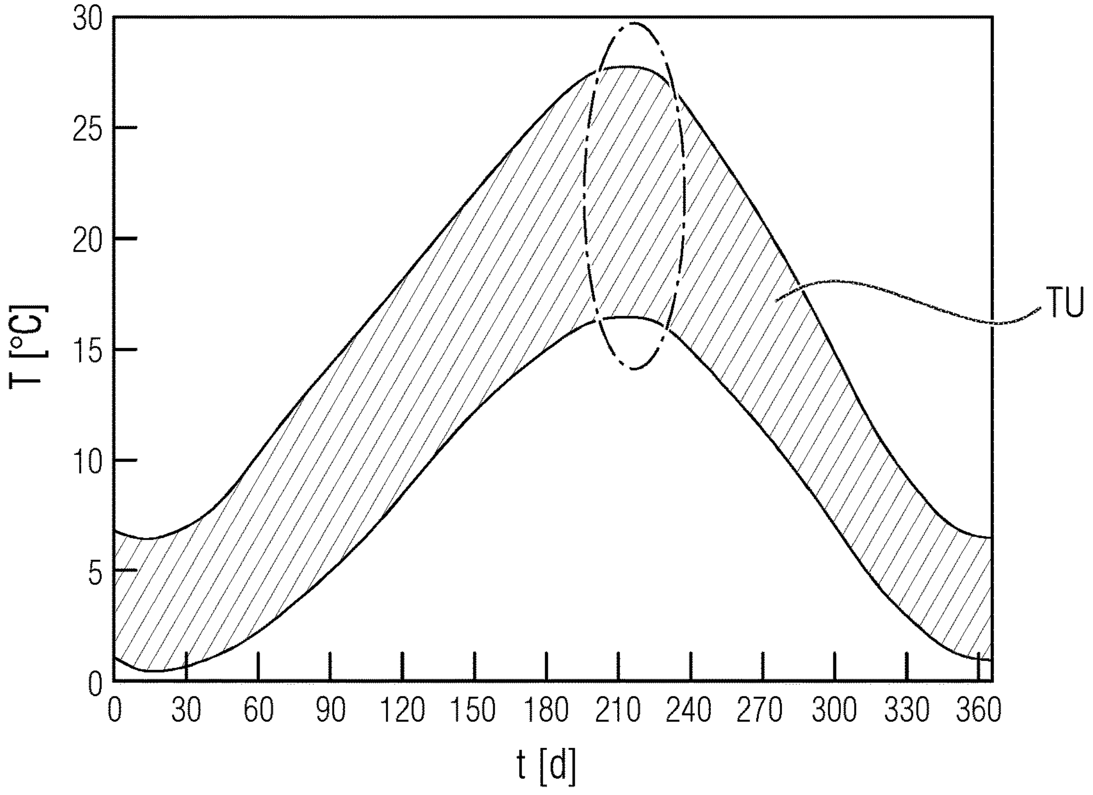
FIG. 4 shows an ambient temperature profile for a year.

The graph from FIG. 4 shows the profile of the ambient temperature used in or underlying the context of the simulation for a year. For each simulation year, the same ambient temperature profile shown in this figure was used.

In addition, the load, voltage, and switch position are expediently taken into consideration. If multiple cooling stages are provided, they can be defined (for example oil pumps, fans).

Figure 5:
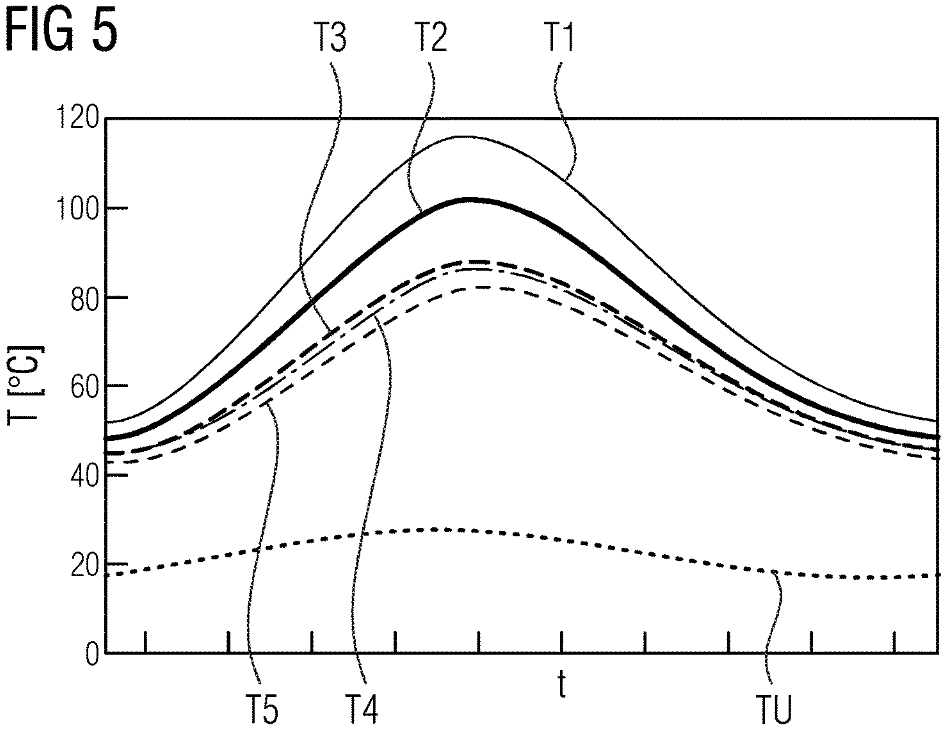
FIG. 5 shows a graph in which local temperatures for various areas of the transformer from FIG. 1 are plotted over a day.

The graph according to FIG. 5 shows temperatures calculated using the aging model 16 for various parts of the insulation arrangement I and areas of the oil 13. The temperatures are plotted over time, wherein the X axis corresponds to an exemplary day here, specifically the hottest day of the year, which is marked in FIG. 4.

The local temperatures from FIG. 5 are:

| | |
|---|---|
| T1 | the temperature of the paper in the hotspot, |
| T2 | the temperature of the spacers at the hotspot, |
| T3 | the temperature of the oil 13 at the top on the winding pressure ring, |
| T4 | the temperature of the hot oil in the cooler 12 (top), |
| T5 | the temperature of the cooled oil 13 (bottom) upon entry below the winding arrangement 4 |
| TU | the ambient temperature |

Figure 6:
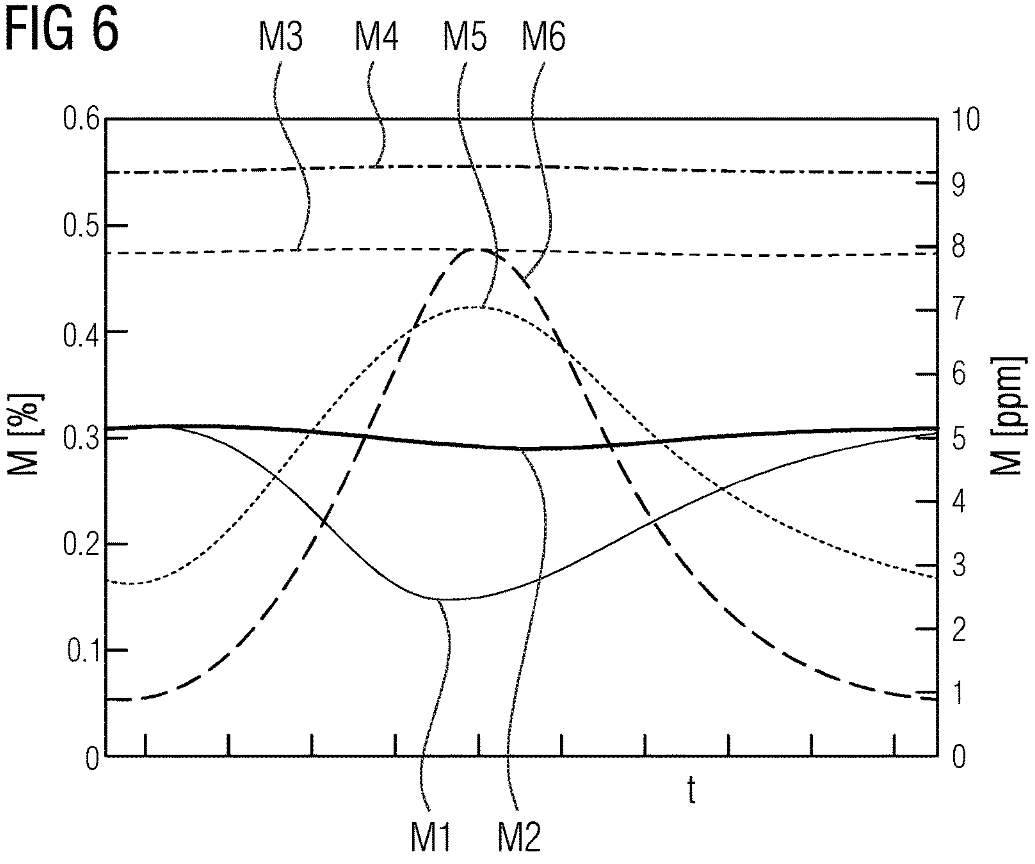
FIG. 6 shows a graph in which the moisture for various areas of the transformer from FIG. 1 is plotted over a day.

FIG. 6 shows the calculated local moisture content for various areas/parts for the exemplary hottest day, namely:

| | |
|---|---|
| M1 | the moisture of the paper wrapping in the hotspot |
| M2 | the moisture of the spacers at the hotspot |
| M3 | the moisture of the winding pressure ring 5 (above the windings) |
| M4 | the moisture of the winding mounting plate 6 (below the windings) |
| M5 | the water activity at cold oil temperature T_bottom |
| M6 | the moisture content in the mineral oil 13 in ppm |

It is to be noted that the scale of the Y axis on the left side shows the moisture content of cellulose in % and the moisture content of oil expressed as water activity (aw) in %—this is the relative moisture vapor pressure, which relates to the vapor pressure of water at the same temperature, while the right Y axis shows the moisture of oil in ppm.

In the scope of the simulation, corresponding values plotted in FIGS. 5 and 6 are calculated using the aging model 16 for each day.

Figure 7:
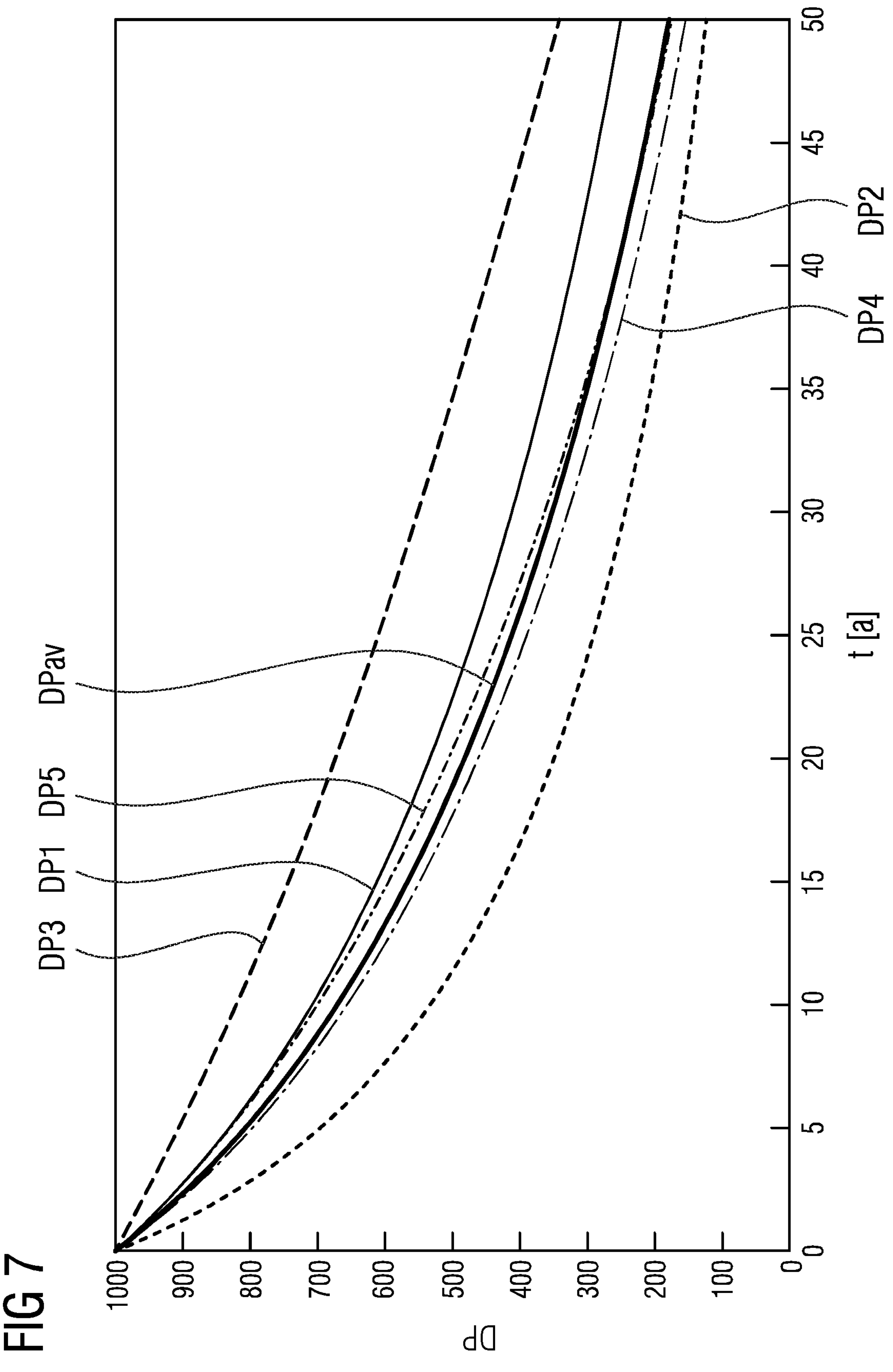
FIG. 7 shows a graph in which local DP values for various areas or parts of the solid insulation arrangement of the transformer from FIG. 1 are plotted over the time in years.

FIG. 7 shows local DP numbers DP1-DP5, (optionally) calculated in step S2 using the aging model 16, for the various solid insulation parts 4-8 of the transformer 1 from FIG. 1 plotted over the time in years. As can be seen, a simulation period of time of 50 years has been selected here, wherein this is to be understood solely as an example. In other words, the decrease of the local DP numbers DP1-DP5 is simulated for a period of time of 50 years. It is noteworthy in this example that due to the selection of thermostabilized paper in the windings, the resulting aging thereof can be less than on other insulating parts.

The local DP numbers from FIG. 7 are specifically:

| | |
|---|---|
| DP1 | DP numbers of the paper wrapping in the hotspot |
| DP2 | DP numbers of the spacers at the hotspot |
| DP3 | DP numbers of the paper wrapping, averaged over a winding |
| DP4 | DP number in the winding pressure ring 5 (above the windings) |
| DP5 | DP number in the winding mounting plate 6 (below the windings) |
| DPav | average value of all local DP values in the network model |

It is to be noted that instead of the DP number of cellulose, alternatively-without prior formation or calculation of the DP number—the generation of substances which are also usable as aging markers, is also calculated on the basis of a time profile, which depends on multiple parameters, such as temperature, moisture, etc. [$CO_2$+CO measurement results versus time: see the above-mentioned Japanese paper by Naoki Yamagata et al.].

As mentioned above, in step S3—in the exemplary embodiment described here in consideration of the local aging variables, here local DP numbers DP1-DP5—amounts of at least one aging product that arises due to the aging of the solid insulation arrangement I and passes into the insulating medium are calculated. In the present case, specifically amounts of $CO_2$+CO and/or amounts of 2-FAL are calculated, wherein this is to be understood as an example.

Figure 8:
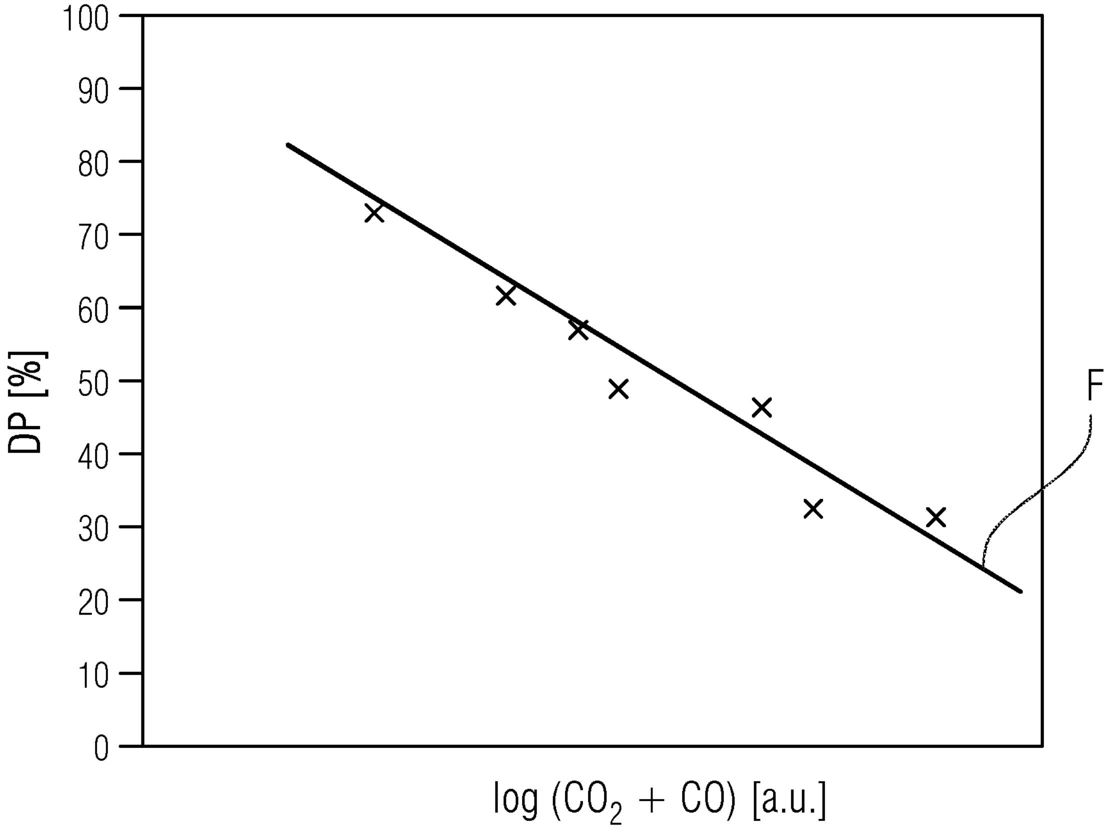
FIG. 8 shows a graph in which DP numbers are plotted over the amount of $CO_2$+CO.

The calculation of the amounts of $CO_2$+CO is carried out here using at least one formula, which was prepared on the basis of metrologically acquired data, here on the basis of metrologically acquired data which link a decreasing DP number with an increasing amount of $CO_2$+CO. FIG. 8 shows solely by way of example an associated graph having corresponding value pairs and an associated fit function F. It is to be emphasized that FIG. 8 is solely of a schematic nature and serves merely for illustration. The X axis is shown unscaled and without units and—as in the present case—can also be logarithmic, for example.

For example, specific measurement results can be used, as are published in the article "Diagnosis of Thermal Degradation for Thermally Upgraded Paper in Mineral Oil" by Naoki Yamagata et al., 2008 International Conference on Condition Monitoring and Diagnosis, Beijing, China, April 21-24, 2008, for example in FIG. 8 of this article. Alternatively or additionally, measurements can be carried out on experimental setups and/or measurements can be carried out on real electrical devices in order to obtain data for a correlation of DP numbers and amounts of $CO_2$+CO.

To alternatively or additionally calculate amounts of 2-FAL, the following equation is preferably used:

$$[2FAL\,(\mu g/g\ \text{Paper})] = ((10^6 * ((DP_0/DP_t) - 1))/162 * DP_0) * 96 * 0.3,$$

In the calculation of the aging product amounts, the equilibrium status thereof between solid insulation arrangement I and insulating medium 13 is taken into consideration, in particular to determine the absorption of the respective aging product, here of $CO_2$+CO and/or 2-FAL, in the insulating medium 13.

Furthermore, a redistribution of the respective aging product, here of $CO_2$+CO and/or 2-FAL, from points having a higher generation rate to points having a lower generation rate via the transport through the insulating medium 13, is taken into consideration.

For this purpose, a gas pressure $p_{A,oil}$, which is proportional to the concentration of the aging product $g_A/g_{Oil}$ or $\mu l_A/l_{Oil}$, is assigned to the aging product "A" dissolved in oil $g_A/g_{Oil}$ (g . . . gram) or $\mu l_A/l_{Oil}$ (I . . . liter). In the cellulose, a concentration of the aging product in the cellulose is assigned to the gas pressure, $g_A/g_{cellulose}=F_{cellulose}\ P_{A,oil}$. This factor $F_{cellulose}$ is expediently to be adapted to the measurement results which result from the network model if laboratory results about the absorption capacity of the aging product in the cellulose are lacking. In the first step, a temperature dependence of the absorption properties is neglected, since it is significantly less than in the case of moisture. In the network model 16, in each iterative computing step, initially the amount of the aging product additionally produced by aging is calculated and added to the preceding value of the aging product dissolved in the cellulose, whereupon in a second step, due to the transfer in the oil, the aging product amount $g_A$ is redistributed between each individual insulating part node and surrounding oil, until in each individual insulating part of the network model, the pressures in solid $P_{A,cellulose}$ and liquid/gaseous insulation $P_{A,oil}$ are equal. Gradual thorough mixing of the aging product dissolved in the oil occurs due to the oil flow, which is taken into consideration in the iterative calculation. With low temperature dependence of the factor $F_{cellulose}$ and slow increase of the aging product amount in relation to the thorough mixing in the flowing oil, a simplification is permitted in that the individual aging product amounts dissolved in oil are immediately distributed homogeneously in all of the oil, according to which as described above as the second step, the equilibrium status results by displacement of the aging product amount using the individual insulation parts (nodes). This is a dynamic process, since the individual local parameters such as temperature are usually "in motion." If a temporarily balanced stationary status should result, the values are identical in all individual local oil volumes and the exchange between solid insulation arrangement and in particular liquid insulating medium has at least briefly come to a standstill, the increase of the aging product in the cellulose is less noticeable in the oil as described above.

As noted above, the thermo-hydraulic aging model 16 used in the scope of the exemplary embodiment described here represents an expanded version of that model from the article "Simulation of long-term transformer operation with a dynamic thermal, moisture and aging model", 5th International Colloquium on Transformer Research and Asset Management, October 2018, Opatija, Croatia. The expansion relates here to the calculation of the amounts of $CO_2$+CO and/or 2-FAL in the ways described above. The additional production of the aging marker takes place for each individual point in the network model, in a second step, a redistribution takes place via the equalization processes via the oil 13. In principle, the assessment of the parts thermally stressed the most, the so-called hotspots in the insulation arrangement I, is in the center point. The aging markers at the hotspots are in interaction, however, due to equalization processes or redistributions. The model 16 is designed accordingly.

The amounts of $CO_2$+CO and/or 2-FAL calculated via the simulation are then preferably used to distinguish between a normal and a faulty status of the transformer 1. For this purpose, the calculated amounts of $CO_2$+CO and/or 2-FAL are each added up to obtain an overall simulation value in each case. Furthermore, corresponding measurement results from a real transformer, for which the transformer 1 from FIG. 1, on which the simulation is based, expediently represents a digital twin, are provided or received from a computer program which is used to carry out the simulation.

In particular, a decision can then be made from the comparison between simulation result(s) and measured value(s) as to whether a normal or a faulty status of the transformer 1 is present. In the latter case, a warning can be output. If no measurement of an "aging markers" such as 2-FAL also takes place, thus no corresponding measurement results for such a comparison are present, an assessment of the aging status takes place since the model 16 makes a statement about the critical aging in the hotspot. This assists the service life observation and thus timely planning of new investments.

Although the invention has been illustrated and described in more detail on the basis of the preferred exemplary embodiment, the invention is not restricted by the examples disclosed, and other variations may be derived herefrom by a person skilled in the art without departing from the scope of protection of the invention.

Irrespective of the grammatical gender of a specific term, persons with male, female, or other gender identity are also included.

The invention claimed is:

1. A method for aging assessment of an electrical device having a solid insulation arrangement and a liquid and/or gaseous insulating medium in contact with the solid insulation arrangement, the method comprising:

S1) providing a thermo-hydraulic aging model of the electrical device and carrying out a simulation for the electrical device using the aging model;

S2) within a scope of the simulation for the electrical device calculating local temperatures for various areas of the electrical device, and calculating local aging variables for the various areas of the solid insulation arrangement in consideration of the local temperatures and optionally further aging-determining influencing variables;

S3) calculating amounts of at least one aging product, which arises due to an aging of the solid insulation arrangement and passes into the insulating medium, for the various areas of the solid insulation arrangement in consideration of the calculated local temperatures and/or, if calculated in step S2, the local aging variables and with additional consideration of masses of the solid insulation arrangement, and using the calculated aging product amounts to distinguish between a normal status and a faulty status of the electrical device.

2. The method according to claim 1, wherein the providing step comprises creating the thermo-hydraulic aging model.

3. The method according to claim 1, configured for status monitoring of a transformer or a choke.

4. The method according to claim 1, wherein step S2 comprises calculating the local aging variables for various areas of the solid insulation arrangement and/or for various areas of the volume occupied by the insulating medium, and calculating local aging variable numbers for various areas of the solid insulation arrangement in consideration of the local temperatures.

5. The method according to claim 1, wherein the optionally further aging-determining influencing variables are at least one of a local moisture or an oxygen content of the insulating medium.

6. The method according to claim 1, which comprises comparing the aging product amounts calculated in step S3 to one or more aging product amounts metrologically acquired on the electrical device and distinguishing between a normal status and a faulty status of the electrical device based on a comparison result.

7. The method according to claim 6, which comprises comparing a sum of the calculated aging product amounts to one or more aging product amounts metrologically acquired on the electrical device.

8. The method according to claim 1, wherein the thermo-hydraulic aging model is configured as a network model.

9. The method according to claim 1, wherein step S3 comprises calculating amounts of 2-furfural and/or $CO_2$+CO as aging product amounts.

10. The method according to claim 1, wherein step S3 comprises, in calculating the aging product amounts for the various areas of the solid insulation arrangement, taking into consideration in each case an equilibrium status of a respective aging product between the solid insulation arrangement and the insulating medium.

11. The method according to claim 10, which further comprises taking into consideration an increase of the respective aging product due to aging and the mixing of the respective aging product in the insulating medium, to determine an absorption of the at least one aging product in the insulating medium.

12. The method according to claim 1, wherein step S3 comprises, in the calculation of the aging product amounts, taking into consideration a redistribution of the at least one aging product from points having a higher generation rate to points having a lower generation rate, via a transport through the insulating medium.

13. The method according to claim 1, wherein step S3 comprises calculating the aging product amounts using at least one formula which is or was prepared on the basis of metrologically acquired data.

14. The method according to claim 1, wherein step S3 comprises calculating amounts of 2-furfural as aging product amounts according to the formula $$[2FAL\,(\mu g/g\ \text{paper})] = ((10^6 * ((DP_0/DP_t) - 1))/162 * DP_0) * 96 * 0.3,$$

wherein:

$DP_0$ is an initial aging variable number;

$DP_t$ is the DP number at an arbitrary point in time during the aging; and

"g paper" is a mass of the solid insulation arrangement or a respective part of the solid insulation arrangement;

wherein the solid insulation arrangement comprises paper and/or pressboard or consists of paper and/or pressboard.

15. The method according to claim 1, wherein the insulating medium comprises or consists of oil and/or the solid insulation arrangement comprises or consists of cellulose.

16. The method according to claim 1, wherein the electrical device comprises a tank filled with the insulating medium, and wherein components of the electrical device are arranged in the tank, and wherein one or more of the components are encased with the solid insulation arrangement.

17. The method according to claim 1, wherein the solid insulation arrangement is formed of a plurality of parts and, in step S2, the various areas of the solid insulation arrangement comprise various parts of the solid insulation arrangement, and wherein various components of the electrical device are assigned various parts of the solid insulation arrangement.

18. The method according to claim 1, which comprises carrying out the simulation of an operation of the electrical device for a simulation period selected from a time period consisting of multiple hours, multiple months, and multiple years.

19. A non-transitory computer program comprising executable instructions which, when the program is executed on at least one computer, cause the at least one computer to carry out the steps of the method according to claim 1.

20. A non-transitory computer-readable medium encoded with executable instructions which, when executed on at least one computer, cause the at least one computer to carry out the method according to claim 1.

* * * * *